United States Patent [19]

Paoli et al.

[11] Patent Number: 5,563,094

[45] Date of Patent: * Oct. 8, 1996

[54] BURIED REVERSE BIAS JUNCTION CONFIGURATIONS IN SEMICONDUCTOR STRUCTURES EMPLOYING PHOTO INDUCED EVAPORATION ENHANCEMENT DURING IN SITU EPITAXIAL GROWTH AND DEVICE STRUCTURES UTILIZING THE SAME

[75] Inventors: Thomas L. Paoli, Los Altos; John E. Epler, Cupertino, both of Calif.

[73] Assignee: Xerox Corporation, Stamford, Conn.

[*] Notice: The portion of the term of this patent subsequent to May 7, 2008, has been disclaimed.

[21] Appl. No.: 581,398

[22] Filed: Sep. 6, 1990

Related U.S. Application Data

[63] Continuation of Ser. No. 328,275, Mar. 24, 1989, abandoned.

[51] Int. Cl.$^6$ ................................................. H01L 21/20
[52] U.S. Cl. ........................ 437/110; 437/129; 437/133; 437/173; 437/915; 148/DIG. 51; 148/DIG. 71; 148/DIG. 95
[58] Field of Search ................................ 372/44, 45, 46; 357/17; 437/81, 108, 110, 111, 126, 129, 133, 141, 160, 161, 173, 247, 936, 943, 963, 987, 915; 148/DIG. 3, 15, 25, 41, 48, 56, 65, 72, 51, 71, 95, 110, 164, 169

[56] References Cited

U.S. PATENT DOCUMENTS

| | | | |
|---|---|---|---|
| 4,329,660 | 5/1982 | Yano et al. | 372/46 |
| 4,771,010 | 9/1988 | Epler et al. | 437/129 |
| 4,810,670 | 3/1989 | Furuyama et al. | 437/129 |
| 4,843,029 | 6/1989 | Joyce et al. | 437/126 |
| 4,843,031 | 6/1989 | Ban et al. | 437/129 |
| 4,847,216 | 7/1989 | d'Avitaya et al. | 437/173 |
| 4,871,690 | 10/1989 | Holonyak, Jr. et al. | 437/173 |
| 4,933,299 | 6/1990 | Durose | 437/81 |
| 4,962,057 | 10/1990 | Epler et al. | 437/173 |
| 4,980,314 | 12/1990 | Strege | 437/129 |
| 4,987,096 | 1/1991 | Ishikawa et al. | 437/129 |
| 4,987,097 | 1/1991 | Nitta et al. | 437/129 |
| 5,013,684 | 5/1991 | Epler et al. | 437/129 |

OTHER PUBLICATIONS

W. D. Goodhue et al, "Planar Quantum wells With Spatially Dependent thicknesses and Al Content", *Journal of Vacuum Science and Technology B*, vol. 6(3), pp. 846–849, May/Jun. 1988.

H. Tanaka et al, "Single–Longitudinal–Mode Self Aligned AlGa(As) Double–Heterostructure Lasers Fabricated by Molecular Beam Epitaxy", *Japanese Journal of Applied Physics*, vol. 24, pp. L89–L90, 1985.

A. C. Warren et al, "Masked, Anisotropic Thermal Etching and Regrowth for In Situ Patterning of Compound Semiconductors", *Applied Physics Letters*, vol. 51(22), pp. 1818–1820, Nov. 30, 1987.

*Primary Examiner*—Robert Kunemund
*Attorney, Agent, or Firm*—William Propp

[57] ABSTRACT

In situ removal of selected or patterned portions of semiconductor layers is accomplished by induced evaporation enhancement to form reversed bias current confinement structures in semiconductor devices, such as heterostructure lasers and array lasers.

9 Claims, 3 Drawing Sheets

BURIED REVERSE BIAS JUNCTION CONFIGURATIONS IN SEMICONDUCTOR STRUCTURES EMPLOYING PHOTO INDUCED EVAPORATION ENHANCEMENT DURING IN SITU EPITAXIAL GROWTH AND DEVICE STRUCTURES UTILIZING THE SAME

GOVERNMENT RIGHTS

The Government has certain rights in this invention pursuant to Contract No. 86F173100 awarded by the Defense Advanced Research Projects Agency (DARPA).

CROSS-REFERENCE TO RELATED APPLICATIONS

This application contains subject matter that is related to subject matter of U.S. Pat. No. 4,962,057; patent application Ser. No. 07/328,988, filed Mar. 24, 1989, now U.S. Pat. No. 5,436,192 and patent application Ser. No. 07/328,214, filed Mar. 24, 1989, now U.S. Pat. No. 5,013,684 both assigned to the same assignee herein and are incorporated herein by reference thereto. This is a continuation of application Ser. No. 07/328,275, filed on Mar. 24, 1989 now abandoned.

BACKGROUND OF THE INVENTION

This invention relates generally to semiconductor laser structures and more particularly to laser structures having buried back biased current confinement means formed in situ that function as optical and current confinement mechanisms for such laser structures.

The employment of buried current blocking layers or current confinement regions to channel current through a selected active region of semiconductor laser devices, such as heterostructure quantum well lasers and array lasers, are well known in the art. However, there is no report or disclosure known by us that attempts or contemplates the fabrication of such current confinement means in situ during growth without at least the requirement of an additional step of, for example, photolithography or chemical etching or masking, to provide such current confinement structures. What is desired is a process, particularly as implemented in MBE or MOCVD, wherein layer patterning can be achieved in situ without growth interruption by some off-line or nongrowth procedure or process.

There are two examples known to us where patterning may be achieved by quasi-in situ thermal processing wherein thermal etching is employed to selectively remove GaAs. In one example, a n-GaAs layer over a p-AlGaAs layer is first, selectively chemically etched in a particular region followed by thermal etching to remove the remaining thin GaAs left from chemical etching before proceeding with regrowth of the p-AlGaAs layer. This forms a buried reverse biased current confinement mechanism in a double heterostructure laser. H. Tanaka et al, "Single-Longitudinal-Mode Self Aligned AlGa(As) Double-Heterostructure Lasers Fabricated by Molecular Beam Epitaxy", *Japanese Journal of Applied Physics*, Vol. 24, pp. L89–L90, 1985. In the other example, a GaAs/AlGaAs heterostructure partially masked by a metallic film is thermally etched in an anisotropic manner illustrating submicron capabilities for device fabrication. A. C. Warren et al, "Masked, Anisotropic Thermal Etching and Regrowth for In Situ Patterning of Compound Semiconductors", *Applied Physics Letters*, Vol. 51(22), pp. 1818–1820, November 30, 1987. In both of these examples, AlGaAs masking layers are recognized as an etch stop to provide for the desired geometric configuration in thermally etched GaAs, although it is also known that, given the proper desorption parameters, AlGaAs may also be thermally etched at higher temperatures with different attending ambient conditions visa vis GaAs.

However, none of these techniques employ in situ photo induced evaporation as a technique in a film deposition system to incrementally reduce, on a minute scale, film thickness in patterned or selective locations at the growth surface either during or after film growth, producing smooth sculptured surface morphology which is a principal objective of this invention.

It is another object of this invention to bring about in situ removal or desorption of selected surface regions or layers of compound semiconductors employing induced evaporation enhancement in metalorganic chemical vapor deposition (MOCVD) epitaxy and to apply this method in the fabrication of optical waveguides and buried heterojunction lasers and laser arrays with in situ fabricated buried back biased junctions for internal current confinement.

SUMMARY OF THE INVENTION

According to this invention, in situ removal or thinning of portions or all of selected regions of deposited films are brought about by a technique employing an irradiation energy source directed to a spot or region of exposure on the growth surface of a substrate or support in a deposition system, e.g., MBE or MOCVD system. This technique, termed "induced evaporation enhancement", is taught in U.S. Pat. No. 4,962,057. In particular, the invention herein is directed to the employment of this technique in fabricating in situ buried current confinement and index waveguide mechanisms in heterostructure lasers and array lasers wherein induced evaporation enhancement purely removes or prevents the continued growth of the epitaxially deposited materials in selected regions at the growth surface without the need or introduction of masking or chemical etching processes. The application of this technique, as particularly described here, provides the opportunity to produce in situ current confinement configurations which effectively channel current to designated regions of a semiconductor device by means of patterned desorption of layer induced evaporation enhancement. For typical semiconductor laser structures, a reverse bias junction configuration is created employing a doped quantum well layer which is heavily doped using a spike doping technique wherein both before and after the growth of the quantum well layer, certain sources of elemental constituents, e.g., Group III sources, are paused to allow an accumulation of a submonolayer coverage of the growth surface by the dopant. In the case of a quantum well of n-GaAs, the dopant source may be, for example Se, which is supplied with a 1% arsine/hydrogen mixture with the Ga source placed on hold to produce a Se spike before and/or after the growth of the n-GaAs quantum well. In this manner, a highly effective but ultra thin buried reverse bias configuration can be produced by a single quantum well layer no thicker than 5 to 10 nm thick. The use of such a thin layer of GaAs has the advantage of being selectively patterned by removal of layer portions within a relatively short period of time, e.g., within several hundreds of seconds.

Thus, while buried reverse bias junctions per se are known in the art, the novelty herein is (1) the in situ formation of such a junction without the use of nongrowth type processes and (2) the use of an ultra thin quantum well layer to form the junction and, more particularly, in combination with sheet doping to provide an effective ultra thin reverse bias junction.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

In describing the devices of this invention, reference is generally made to individual discrete structures although it is generally the case that a plurality of such devices would be fabricated on a wafer substrate in a MOCVD reactor wherein the processing laser beam would be scanned and/or modulated to selected locations to perform the desired induced evaporation enhancement in patterned fashion across the wafer surface. Also, many of the structures disclosed contain a separate confinement cavity for the active region for purposes of illustration, which is not a specific requirement in the exercise of this invention.

Figure 1:
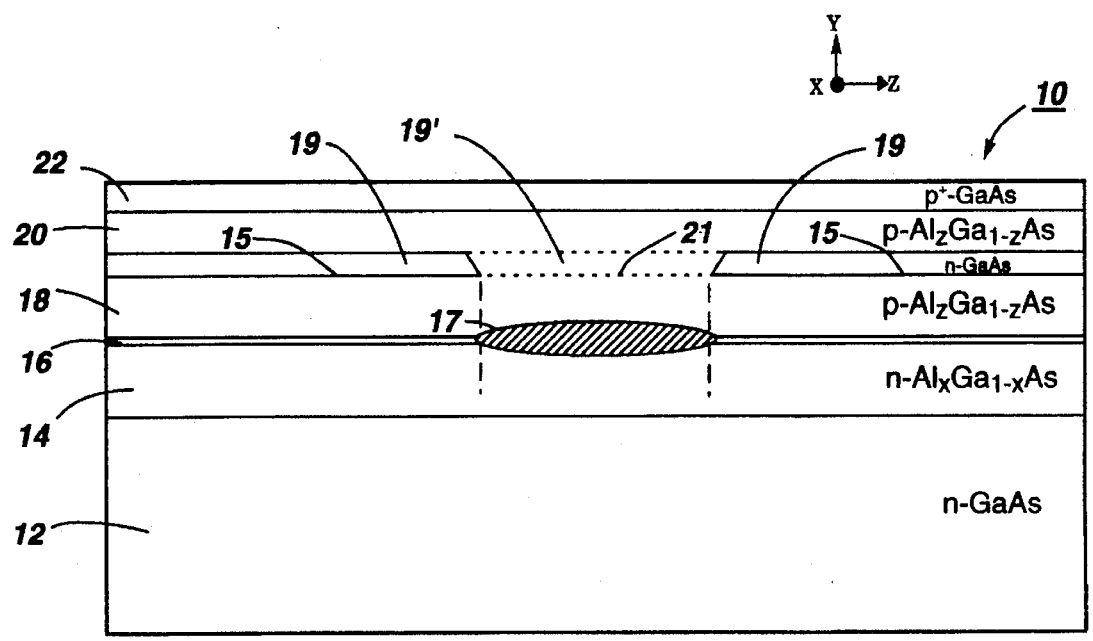
FIG. 1 is a schematic illustration of a side elevation of a heterostructure laser with buried back biased current confinement formed according to this invention.

Reference is now made to FIG. 1 wherein there is shown a laser 10 having a single emitter and fabricated using MOCVD processing as described in incorporated U.S. Pat. No. 4,962,057. Laser 10, for example, may comprise a substrate 12 upon which are deposited the following layers or regions: a cladding layer 14 of n-$Ga_{1-x}Al_xAs$; an active region 16 being undoped, or p-type doped or n-type doped and can comprise a relatively thin conventional double heterostructure (DH) active layer or a single quantum well of either GaAs or $Ga_{1-y}Al_yAs$ where x>y or a multiple quantum well structure of alternating well layers of GaAs or $Ga_{1-y}Al_yAs$ and corresponding barrier layers of either AlAs or $Ga_{1-y'}Al_{y'}As$, where x, y'>y or a separate single or multiple quantum well structure in a separate confinement cavity; a cladding layer 18 of p-$Ga_{1-z}Al_zAs$ where x, z, y'>y; a n-GaAs layer 19 followed by another cladding layer 20 of p-$Ga_{1-z}Al_zAs$, which is an extension of layer 18 and, finally cap layer 22 of p+GaAs.

Fabrication of these layers is continuous through the growth of layer 19 at which time epitaxial growth is interrupted and, as taught in U.S. Pat. No. 4,962,057, supra, the TMG source to the MOCVD chamber is turned off, the substrate temperature is increased to about 825° C. and a radiation beam is focused to an elongated region 19' of layer 19 and scanned in the X direction perpendicular the plane of FIG. 1 for a period of time sufficient to thermally evaporate region 19' to the interface 21 at layer 18 at a rate of 1 Å/second. The temperature at region 19' during the evaporation process in the As/H attending environment may be about 1000° C. to 1030° C. After the removal of GaAs region 19', epitaxial growth is continued with the deposition of layers 20 and 22. The p-$Ga_{1-z}Al_zAs$ region now formed in region 19' through n-GaAs film 19 forms a current channel while the remaining regions of film 19 form reverse biased p-n junctions 15 to provide for current confinement through channel 19' to active region 17 of laser 10. Appropriate metallization may then be performed at the outer surfaces of layer 22 and substrate 12 as is known in the art. The processing techniques in U.S. Pat. No. 4,962,057 permit the full in situ processing of a buried 3-D current confinement configuration in semiconductor devices without removal of the structure from the MOCVD reactor or movement or masking of the structure in the reactor.

Figure 2:
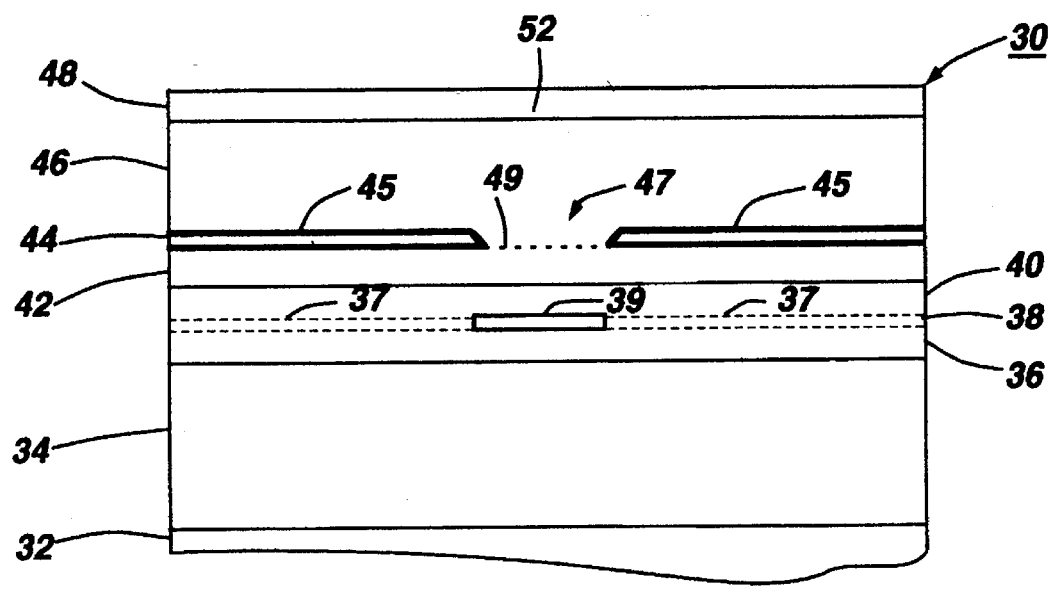
FIGS. 2 is a schematic illustration of a side elevation of a heterostructure laser with a buried active region and a modified buried back biased current confinement in the upper cladding layer formed according to this invention.
Figure 3:
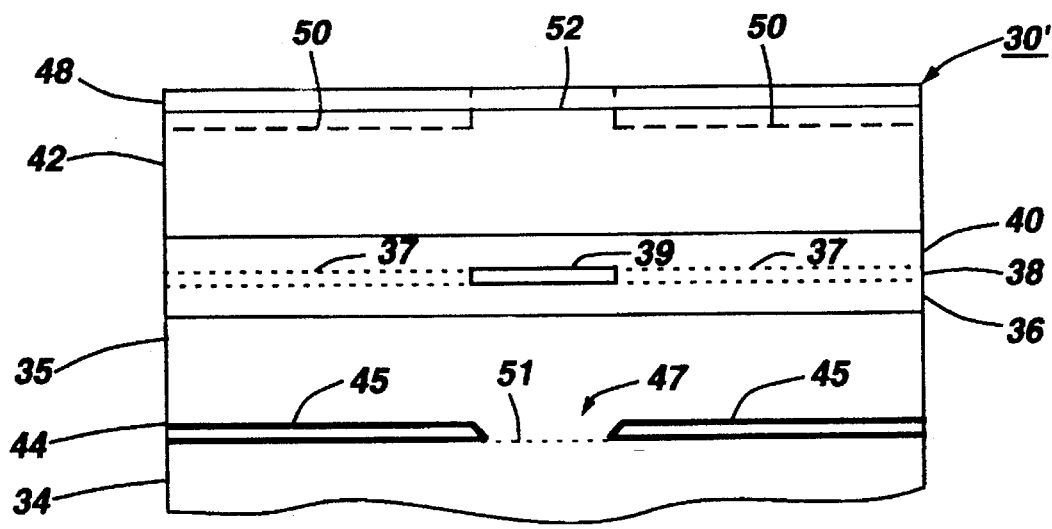
FIG. 3 is a schematic illustration of a side elevation of a heterostructure laser with a buried active region and a modified buried back biased current confinement in the lower cladding layer formed according to this invention.

FIGS. 2 and 3 disclose laser structures including a reverse bias junction in the cladding region of the laser for purposes of current confinement and a buried active region, both of which are formed in situ during epitaxial growth employing induced evaporation enhancement. In FIG. 2, reverse bias junction laser 30 comprises substrate 32 of n-GaAs upon which is epitaxially deposited an outer confinement layer 34 of n-$Al_xGa_{1-x}As$ (e.g., 0.66 μm thick and x=0.8), inner confinement waveguide layer 36 of n-$Al_yGa_{1-y}As$ where x>y (e.g., 0.06 μm thick and y=0.4), active region 38 of undoped, or p-type doped or n-type doped layer or layers and may comprise a relatively thin conventional double heterostructure (DH) active layer or a single quantum well of either GaAs or $Al_zGa_{1-z}As$ where z is very small and x>y>z (e.g., in either case 13.6 nm thick and z=0.01), or a multiple quantum well structure of alternating well layers of GaAs or $Al_zGa_{1-z}As$ and corresponding barrier layers of either AlAs or $Al_zGa_{1-z'}As$, where z>y>z'>z.

Upon completion of the growth of active region 38, however, epitaxial growth is temporally discontinued, the metalorganic sources are vented, a 1% arsine/hydrogen mixture is introduced into the MOCVD chamber and a laser beam or combination laser beam is focussed on the surface of active region 38 in areas indicated by dotted lines 37 and in accordance with the teachings of U.S. Pat. No. 4,962,057, these areas of the active region are desorbed down to the interface with inner confinement layer 36 resulting in active region strip region 39. To be noted is that the $Al_yGa_{1-y}As$ layer 36 functions as a desorption stop to the optical patterned desorption because AlGaAs is much more difficult to desorb according to this process as compared to the desorption of GaAs. Epitaxial growth is then continued with the growth of inner cladding layer 40 of p-$Al_yGa_{1-y}As$ (e.g., 0.06 μm thick and y=0.8) and first outer confinement layer 42 of p-$Al_AGa_{1-A}As$ (e.g., 0.06 μm thick and A=0.8) where x≧or ≦A≧y>z'>z.

At this time a n-type doped QW layer 44 is grown on confinement layer 42 comprising n-GaAs heavy doped, for example, with Si or Se at a concentration of $10^{19}/cm^3$ and is represented by the bold lines outlining this layer. This layer 44 may be about 7.5 mm thick. The growth of layer 44 is accomplished by first shutting off for a short period of time Group III sources, i.e., the Ga source, with continued flow of a mixture of As and $H_2$ to form an impurity spike comprising a submonolayer or monolayer of an impurity species, such as Se, followed by the growth of n-GaAs via the return of the Ga source flow to form layer 44 followed by the growth of a second or another submonolayer or monolayer of impurity species. The characterization of these two submonolayers are also referred to as impurity sheet doping, e.g., Se sheet doping, and are represented by the bold lines outlining reverse bias configuration. In this manner, a highly effective but ultra thin buried reverse bias configuration can be produced by a single quantum well layer no thicker than 5 to 10 nm thick. The use of such a thin layer of GaAs has the advantage of being selectively patterned by removal of layer portions within a relatively short period of time, e.g., within several hundreds of seconds.

In connection with the above example, it should be understood that only one doping sheet possibly need be employed rather than two doping sheets as described. The single doping sheet would be placed on the surface of laser 44 that is to form the reverse bias function with a contiguous layer relative to the forward applied injection current. In the case here, that would be the second mentioned submonolayer of impurity species.

After the growth of layer 44, the growth is again temporarily discontinued, the metalorganic sources are vented, a 1% arsine/hydrogen mixture is introduced into the MOCVD chamber and a laser beam is focussed to the central region of layer 44 to provide a temperature gradient sufficient to induce the desorption of a strip in the n-GaAs down to interface 49 with outer confinement layer 42 forming channel 47 in layer 44. The $Al_A Ga_{1-A} As$ layer 42 functions as a desorption stop to the optically patterned desorption at 47 because AlGaAs is more difficult to desorb compared to GaAs. As an example here, for a period of 300 seconds, GaAs is desorbed at channel 47 at a rate of about 0.03 mm/s with a temperature of approximately 1030° C. from a 3-mm diameter focussed laser spot.

After removal of channel 47 by induced evaporation enhancement forming reverse bias junction configuration 45, epitaxial growth is continued with the growth of second outer confinement layer 46 of $p-Al_B Ga_{1-B} As$ (e.g., 0.45 μm thick and B=0.8 where $x \geq A \geq$ or $\leq B > y > z' > z$, followed by the growth of cap layer 48 of p+-GaAs (e.g., Mg doped and 0.05 μm thick).

As an example, layers 42 and 46 may both be comprised of $Al_{0.8}Ga_{0.2}As$. This structure provides for an index guide that has emphasis on lateral waveguiding properties. On the other hand, with B>A, an antiguiding structure can be created in conjunction with reverse biased junction configuration 45, e.g., layer 42 may be $Al_{0.8}Ga_{0.2}As$ and layer 46 may be $Al_{0.4}Ga_{0.6}As$. This antiguiding structure enables high power operation in a stable mode by spreading optical power across a large lateral dimension at the output facet of the laser structure.

Figure 6:
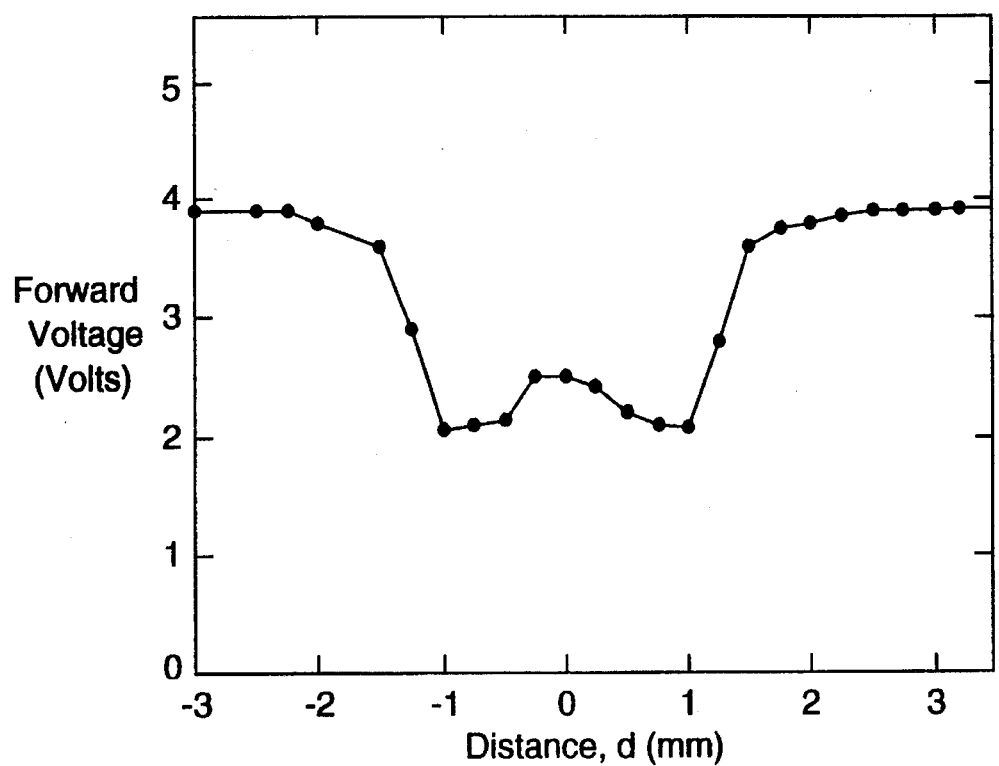
FIG. 6 is a graphical illustration of applied forward voltage as a function of position along the lateral extent of a reverse bias junction configuration of the laser structure shown in FIG. 2.

FIG. 6 illustrates actual data pertaining to the nature of operation of reverse bias junction configuration 45 as analyzed laterally across its width relative to forward voltage at 10 mA as a function of position laterally along the device. Layer 44 was a Se doped GaAs QW layer approximately 7.5 nm thick. Total laser power employed was 7.4 W and temperature of the substrate was 800° C. It took approximately 300 seconds to remove layer 44 to form channel 47 therethrough. It can be seen that the forward voltage is about 2 fold greater over the configuration 45 as compared to channel 47. The series resistance under forward bias is also reduced to 8Ω in channel 47 compared to 11.5Ω outside channel 47. The spatial variation of the forward voltage and series resistance clearly indicates the region or channel 47 over which reverse biased layer 44 has been removed. The extent of the desorbed region 47 approximately corresponds with the spot size of the laser radiation at the surface of layer 44. Near the center of the laser beam spot the forward voltage increases indicative possibly of effects due to over exposure with the laser beam.

In FIG. 3, the reverse biased junction laser 30' is identical in structure to laser 30 except that reverse bias junction layer 44 is p-doped with junction configuration 45 in the lower outer cladding layer 34 so that epitaxial growth is interrupted after completion of epitaxial growth of layers 34 and 44. As in the case for FIG. 2, the laser beam is focussed to the central region of layer 44 to provide a temperature gradient sufficient to induce the desorption of a strip in the p-GaAs down to interface 51 with layer 34 forming a channel 47 in layer 44. Growth is then continued with the epitaxial growth of outer cladding layer 35 of $n-Al_w Ga_{1-w} As$ where w>y>z and thence layers 36 and 38 with the previously described formation of buried heterostructure active region 39 and thence the sequential growth of layers 39, 40, 42 and 48.

Current confinement strip 52, defined by proton or ion implant regions 50 is optional in this embodiment.

Figure 4:
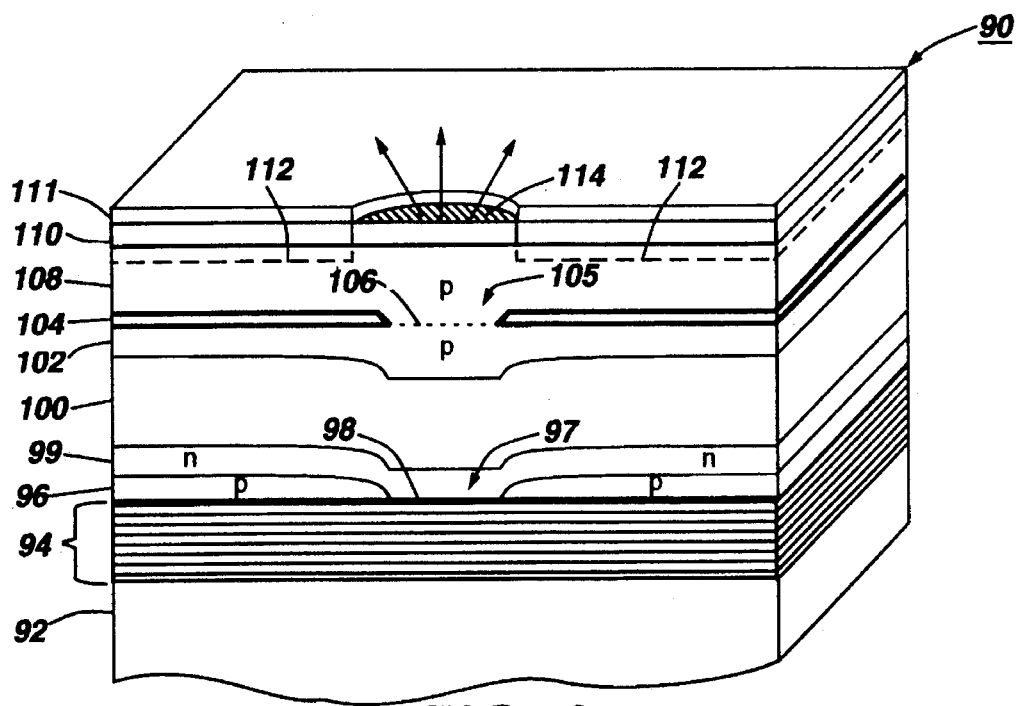
FIG. 4 is a schematic illustration of a side elevation of a surface emitting heterostructure laser with buried back biased current confinement formed according to this invention.

In FIG. 4, there is disclosed a surface emitting laser 90 comprising a n-GaAs substrate 92 of n-GaAs upon which is epitaxially deposited a DBR comprising alternating layers of $n-Al_w Ga_{1-w} As$ and $n-Al_u Ga_{1-u} As$ where w>u followed by a first reverse junction layer 96 of p-GaAs, which may be of quatum size and provided with sheet doping at its surfaces, e.g., Mg. DBR 94, as optically and current confined by reverse bias junction layers 96 and 99, functions as a mirror for optical feedback for the vertically disposed Fabry-Perot of the laser structure with surface emission at 114.

After the growth of layer 96, epitaxial growth is temporarily discontinued, the metalorganic sources are vented, a 1% arsine/hydrogen mixture is introduced into the MOCVD chamber and a laser beam is focussed to the central region of layer 96 to provide a temperature gradient sufficient to induce the desorption of a circular aperture 97 or other shaped region in this n-GaAs layer down to interface 98 with DBR 94. Epitaxial growth is then continued with the growth of a second junction layer 99 of $n-Al_x Ga_{1-x} As$, forming the reverse bias junction with layer 96, followed by relatively thick active region 100 of undoped, or p-type doped or n-type doped layer or layers and may comprise a relatively thick conventional double heterostructure (DH) active layer or a multiple quantum well structure of alternating well layers of GaAs or $Al_z Ga_{1-z} As$ and corresponding barrier layers of either AlAs or $Al_{z'} Ga_{1-z'} As$, where x, y>z'>z, cladding layer 102 of $p-Al_y Ga_{1-y} As$ and n-type doped QW layer 104 which comprises n-GaAs heavy doped, for example, with Si or Se at a concentration of $10^{19}/cm^3$, which layer may be about 7.5 nm thick.

After the growth of layer 104, the growth is again temporarily discontinued, the metalorganic sources are vented, a 1% arsine/hydrogen mixture is introduced into the MOCVD chamber and the laser beam spot is focussed to the central region of layer 104 to provide a temperature gradient sufficient to induce the desorption of a circular opening in the n-GaAs down to interface 106 with layer 102 forming a circular aperture 105 which is in appropriate alignment with aperture 97.

After removal of region 105 by induced evaporation enhancement, epitaxial growth is continued with the growth of second outer confinement layer 108 of p-Al$_B$Ga$_{1-B}$As where A≧B>x, y>z'>z, followed by the growth of cap layer 110 of p+-AlGaAs, for example, Al$_{0.5}$Ga$_{0.95}$As. If cap layer 110 is QW size, p+-GaAs, an aperture below output aperture 114 must be formed in the layer to prevent radiation absorption by the GaAs. Zn diffusion is performed at 112 for good ohmic contact with metal contact 111.

Figure 5:
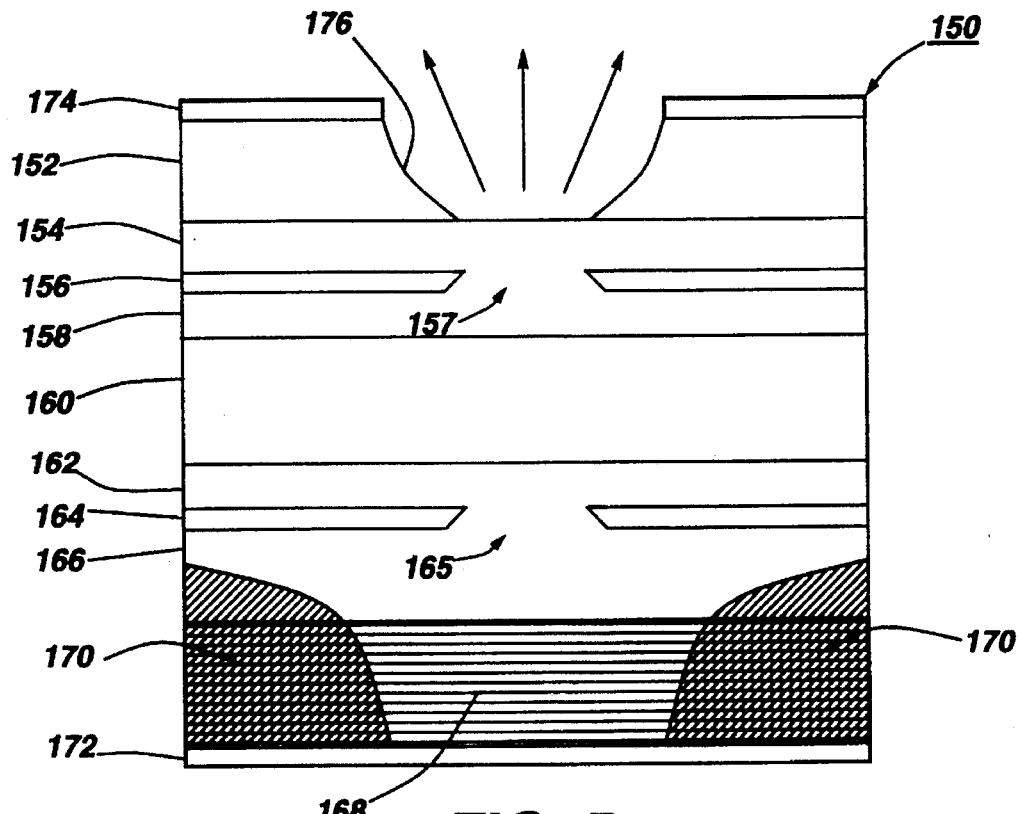
FIG. 5 is a schematic illustration of a side elevation of another surface emitting heterostructure laser with double buried back biased current confinement formed according to this invention.

Reference is now made to FIG. 5 wherein the surface emitter laser 150 has a structure similar to the laser structure shown in FIG. 4 except that the order of epitaxial growth is reversed relative to the substrate so that the DBR is the last structure epitaxially grown rather than the first. With the DBR on top, current injection can be achieved via an impurity diffusion.

Laser 150 comprises substrate 152 of n-GaAs upon which is grown an outer cladding layer 154 of n-Al$_x$Ga$_{1-x}$As followed by reverse biased junction layer 156 of heavily doped p-GaAs. After the growth of layer 156, epitaxial growth is temporarily discontinued, the metalorganic sources are vented, a 1% arsine/hydrogen mixture is introduced into the MOCVD chamber and a laser beam is focussed to the central region of layer 156 to provide a temperature gradient sufficient to induce the desorption of a circular spot in this p-GaAs layer down to its interface with layer 154 forming a circular aperture 157 in layer 156 for current channeling.

Epitaxial growth is continued with the growth of inner cladding layer 158 comprising n-Al$_x$Ga$_{1-x}$As followed by the growth of thick active region 160 of undoped, or p-type doped or n-type doped layer or layers and may comprise a relatively thick conventional double heterostructure (DH) active layer or a multiple quantum well structure of alternating well layers of GaAs or Al$_z$Ga$_{1-z}$As and corresponding barrier layers of either AlAs or Al$_{z'}$Ga$_{1-z'}$As, where z>y>z'>z, inner cladding layer 162 of p-Al$_y$Ga$_{1-y}$As and reverse biased junction layer 164 of n-GaAs. Both reverse bias junction layers 156 and 164 may be quantum well layers.

After the growth of reverse biased junction layer 164, the growth is again temporarily discontinued, the metalorganic sources are vented, a 1% arsine/hydrogen mixture is introduced into the MOCVD chamber and the laser beam spot is focussed to the central region of layer 164 to provide a temperature gradient sufficient to induce the desorption of a circular opening or any other desired shape in the n-GaAs layer down to interface with layer 162 forming a circular aperture 165 in layer 164 which is approximately concentric with aperture 157.

After removal of region 165 by induced evaporation enhancement, epitaxial growth is continued with the growth of outer confinement layer 166 of p-Al$_y$Ga$_{1-y}$As followed by the epitaxial deposition of DBR 168 comprising alternating layers of undoped Al$_w$Ga$_{1-w}$As and Al$_u$Ga$_{1-u}$As where w>u. The growth of DBR 168 is followed by a Zn diffusion into DBR 168 forming p-type regions 170 for current injection into layer 166. The Zn concentration level may be made sufficiently high during this diffusion step to provide current confinement outside the central portion of DBR 168 so that the undoped DBR 168 contains no free carriers and optical confinement to the central portion of DBR 168. In any case, the remaining portion of DBR 168 functions as a reflector for optical feedback for the propagating radiation.

Surface emitter 150 is completed by an annular aperture 176 etched through the highly absorbent GaAs substrate 152 to provide for surface emission and the deposit of metal contacts 172 and 174.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A method of forming a buried reverse bias junction in a semiconductor laser structure comprising the steps of:

epitaxially depositing several semiconductor layers on a substrate, alternating layers of a plurality of said semiconductor layers to form a DBR, one of said semiconductor layers deposited subsequent to said DBR having an opposite conductivity type relative to immediately adjacent layers, interrupting the epitaxial growth of said semiconductor layers after the deposition of said layer having an opposite conductivity type, selectively desorbing in situ portions of said layer having an opposite conductivity type to the interface with the layer therebeneath employing photo induced evaporation to form a first reverse bias junction containing at least one current channel, epitaxial depositing several semiconductor layers, one of said semiconductor layers having an active region for light wave generation and propogation under lasing conditions with a Fabry-Perot cavity transverse to the planar extent of said active region, one of said semiconductor layers deposited subsequent to said active layer having an opposite conductivity type relative to immediately adjacent layers, interrupting the epitaxial growth of said semiconductor layers after the deposition of said layer having an opposite conductivity type, selectively desorbing in situ portions of said layer having an opposite conductivity type to the interface with the layer therebeneath employing photo induced evaporation to form a second reverse bias junction containing a second a reverse bias junction containing at least one current channel, and continuing the epitaxial deposition of the remaining semiconductor layers.

2. The method of forming a buried reverse bias junction in a semiconductor laser structure of claim 1 wherein said current channels for said first and second reverse bias junctions and said active layer are in alignment.

3. The method of forming a buried reverse bias junction in a semiconductor laser structure of claim 2 further comprising a surface emission region on the opposite end of said Fabry-Perot cavity from said DBR.

4. A method of forming a buried reverse bias junction in a semiconductor laser structure comprising the steps of:

epitaxially depositing several semiconductor layers on a substrate, one of said layers having an opposite conductivity type relative to immediately adjacent layers, interrupting the epitaxial growth of said semiconductor layers after the deposition of said layer having an opposite conductivity type, selectively desorbing in situ portions of said layer having an opposite conductivity type to the interface with the layer therebeneath employing photo induced evaporation to form a first reverse bias junction containing at least one current channel, epitaxial depositing several semiconductor layers, one of said semiconductor layers having an active region for light wave generation and propogation under lasing conditions with a Fabry-Perot cavity transverse to the planar extent of said active region, one of said semiconductor layers deposited subsequent to said active layer having an opposite conductivity type relative to immediately adjacent layers, interrupting the epitaxial growth of said semiconductor layers after the deposition of said layer having an opposite conductivity type, selectively desorbing in situ portions of said layer having an opposite conductivity type to the interface with the layer therebeneath employing photo induced evaporation to form a second reverse bias junction containing a second a reverse bias junction containing at least one current channel, and continuing the epitaxial deposition of the remaining semiconductor layers, alternating layers of a plurality of said remaining semiconductor layers to form a DBR.

5. The method of forming a buried reverse bias junction in a semiconductor laser structure of claim 4 wherein said current channels for said first and second reverse bias junctions and said active layer are in alignment.

6. The method of forming a buried reverse bias junction in a semiconductor laser structure of claim 5 further comprising a surface emission region on the opposite end of said Fabry-Perot cavity from said DBR.

7. The method of forming a buried reverse bias junction in a semiconductor laser structure of claim 4 further comprising the step of:

impurity induced disordering in said DBR outside the region of said Fabry-Perot cavity to provide for both optical confinement for propagating radiation in said cavity and current injection means to said active region.

8. A method of forming a buried reverse bias junction in a semiconductor structure comprising the steps of:

epitaxially depositing several semiconductor layers on a substrate, one of said layers being a quantum well layer having a doping content of opposite conductivity type relative to immediately adjacent layers and containing a heavy concentration of an impurity series, interrupting the epitaxial growth of said semiconductor layers after the deposition of said doped quantum well layer, selectively desorbing in situ portions of said doped quantum well layer to the interface with the layer therebetween employing photo induced evaporation to form a reverse bias junction containing at least one current channel, a submonolayer of an impurity species epitaxially deposited prior to or subsequent to said epitaxial deposition of said doped quantum well layer, said submonolayer being adjacent to said doped quantum well layer, and continuing the epitaxial deposition of the remaining semiconductor layers.

9. A method of forming a buried reverse bias junction in a semiconductor structure comprising the steps of:

epitaxially depositing several semiconductor layers on a substrate, one of said layers being a quantum well layer having a doping content of opposite conductivity type relative to immediately adjacent layers and containing a heavy concentration of an impurity series, interrupting the epitaxial growth of said semiconductor layers after the deposition of said doped quantum well layer, selectively desorbing in situ portions of said doped quantum well layer to the interface with the layer therebeneath employing photo induced evaporation to form a reverse bias junction containing at least one current channel, a submonolayer of an impurity species epitaxially deposited prior to and subsequent to said epitaxial deposition of said doped quantum well layer, said submonolayers being adjacent to said doped quantum well layer, and continuing the epitaxial deposition of the remaining semiconductor layers.

\* \* \* \* \*